(12) United States Patent
Chou et al.

(10) Patent No.: US 12,183,626 B2
(45) Date of Patent: Dec. 31, 2024

(54) METAL INTERCONNECT STRUCTURE HAVING CAP LAYER WITH DIFFERENT THICKNESSES AND METHOD FOR FABRICATING THE SAME

(71) Applicant: UNITED MICROELECTRONICS CORP., Hsin-Chu (TW)

(72) Inventors: Yi-How Chou, New Taipei (TW); Tzu-Hao Fu, Kaohsiung (TW); Tsung-Yin Hsieh, Tainan (TW); Chih-Sheng Chang, Tainan (TW); Shih-Chun Tsai, Pingtung County (TW); Kun-Chen Ho, Tainan (TW); Yang-Chou Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 241 days.

(21) Appl. No.: 17/883,647

(22) Filed: Aug. 9, 2022

(65) Prior Publication Data

US 2022/0384254 A1 Dec. 1, 2022

Related U.S. Application Data

(60) Continuation of application No. 16/992,055, filed on Aug. 12, 2020, now Pat. No. 11,450,558, which is a
(Continued)

(30) Foreign Application Priority Data

Aug. 16, 2018 (CN) .......................... 201810933058.X

(51) Int. Cl.
*H01L 21/768* (2006.01)
*H01L 23/522* (2006.01)
*H01L 23/532* (2006.01)

(52) U.S. Cl.
CPC .. *H01L 21/76814* (2013.01); *H01L 21/76813* (2013.01); *H01L 21/76826* (2013.01);
(Continued)

(58) Field of Classification Search
CPC ......... H01L 21/76814; H01L 21/76813; H01L 21/76826; H01L 21/76835;
(Continued)

(56) References Cited

U.S. PATENT DOCUMENTS 6,258,713 B1   7/2001   Yu
6,797,627 B1   9/2004   Shih
(Continued)

FOREIGN PATENT DOCUMENTS

CN   1426107 A   6/2003
CN   1694239 A   11/2005

*Primary Examiner* — Britt D Hanley
*Assistant Examiner* — Vicki B. Booker
(74) *Attorney, Agent, or Firm* — Winston Hsu

(57) ABSTRACT

A metal interconnect structure includes a first metal interconnection in an inter-metal dielectric (IMD) layer on a substrate, a second metal interconnection on the first metal interconnection, and a cap layer between the first metal interconnection and the second metal interconnection. Preferably, a top surface of the first metal interconnection is even with a top surface of the IMD layer and the cap layer is made of conductive material.

9 Claims, 6 Drawing Sheets

Related U.S. Application Data division of application No. 16/134,902, filed on Sep. 18, 2018, now Pat. No. 10,784,153.

(52) U.S. Cl.
CPC .. *H01L 21/76835* (2013.01); *H01L 21/76843* (2013.01); *H01L 23/5226* (2013.01); *H01L 23/53238* (2013.01)

(58) Field of Classification Search
CPC ......... H01L 21/76843; H01L 21/02063; H01L 21/7682; H01L 21/76805; H01L 21/76849; H01L 21/76807; H01L 21/7685; H01L 23/5226; H01L 23/53238; H01L 23/5386
See application file for complete search history.

(56) References Cited

U.S. PATENT DOCUMENTS

| | | | |
|---|---|---|---|
| 9,059,176 | B2 | 6/2015 | Baumann |
| 9,177,858 | B1 | 11/2015 | Zhang |
| 10,204,829 | B1 * | 2/2019 | Amanapu ........... H01L 21/7684 |
| 10,276,505 | B2 | 4/2019 | Kim |
| 2002/0162736 | A1 | 11/2002 | Ngo |
| 2004/0219795 | A1 | 11/2004 | Li et al. |
| 2006/0030143 | A1 | 2/2006 | Ivanov |
| 2006/0163739 | A1 | 7/2006 | Komai |
| 2006/0252256 | A1 | 11/2006 | Weng |
| 2009/0079077 | A1 | 3/2009 | Yang et al. |
| 2009/0108462 | A1 | 4/2009 | Peters |
| 2009/0142931 | A1 | 6/2009 | Wang |
| 2009/0275195 | A1 | 11/2009 | Yu |
| 2016/0276280 | A1 | 9/2016 | Edelstein et al. |
| 2017/0018458 | A1 | 1/2017 | Cheng |
| 2017/0278742 | A1 | 9/2017 | Chen |
| 2018/0261544 | A1 * | 9/2018 | Kim ................. H01L 23/53223 |

* cited by examiner

METAL INTERCONNECT STRUCTURE HAVING CAP LAYER WITH DIFFERENT THICKNESSES AND METHOD FOR FABRICATING THE SAME

CROSS REFERENCE TO RELATED APPLICATIONS

This application is a continuation application of U.S. application Ser. No. 16/992,055, filed on Aug. 12, 2020, which is a division of U.S. application Ser. No. 16/134,902, filed on Sep. 18, 2018. The contents of these applications are incorporated herein by reference.

BACKGROUND OF THE INVENTION

1. Field of the Invention

The invention relates a metal interconnect structure, and more particularly to a metal interconnect structure having cap layer with different thicknesses.

2. Description of the Prior Art

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 μm) semiconductor process, copper (Cu) dual damascene process is becoming more widely used as a standard process in forming interconnection lines within the inter-metal dielectric layer of low dielectric constant (low k) materials. Since copper has the traits of having both low resistance and low electromigration resistance, low k materials are useful in improving the RC delay effect of metal interconnections.

However, discontinuous copper metal line has often been observed near the bottom of via conductors and the trench conductor underneath as a result of etching process conducted during dual damascene process thereby affecting the performance of the device. Hence, how to improve this issue has become an important task in this field.

SUMMARY OF THE INVENTION

According to an embodiment of the present invention, a method for fabricating metal interconnect structure includes the steps of: forming a first metal interconnection in a first inter-metal dielectric (IMD) layer on a substrate; forming a cap layer on the first metal interconnection; forming a second IMD layer on the cap layer; performing a first etching process to remove part of the second IMD layer for forming an opening; performing a plasma treatment process; and performing a second etching process to remove polymers from bottom of the opening.

According to another aspect of the present invention, a metal interconnect structure includes a first metal interconnection in an inter-metal dielectric (IMD) layer on a substrate, a second metal interconnection on the first metal interconnection, a cap layer between the first metal interconnection and the second metal interconnection, and an air gap in the cap layer. Preferably, a top surface of the first metal interconnection is even with a top surface of the IMD layer and the cap layer is made of conductive material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
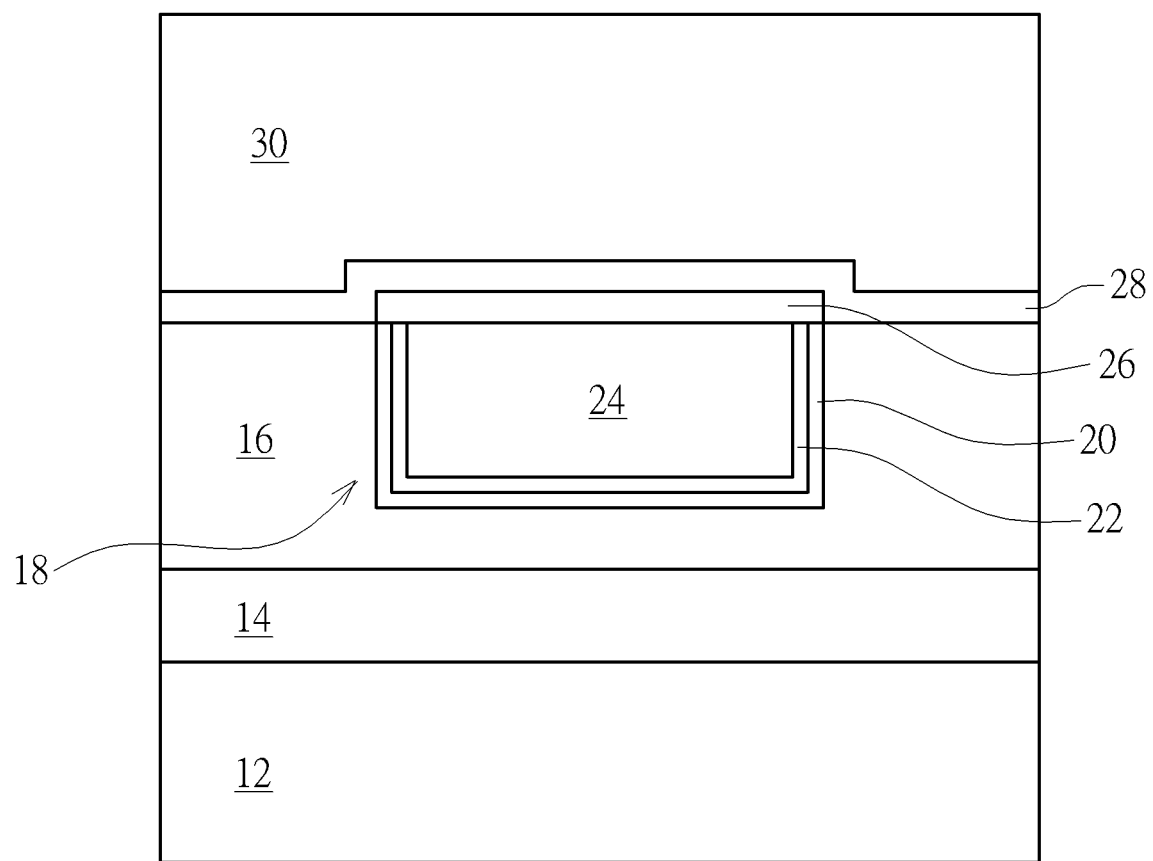
FIGS. 1-5 illustrate a method for fabricating metal interconnect structure according to a preferred embodiment of the present invention.

Referring to FIGS. 1-5, FIGS. 1-5 illustrate a method for fabricating metal interconnect structure according to a preferred embodiment of the present invention. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer 14 could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacer, epitaxial layer, contact etch stop layer (CESL), the ILD layer 14 could be formed on the substrate 12 and covering the MOS transistors, and a plurality of contact plugs could be formed in the ILD layer 14 to electrically connect to the gate and/or source/drain region of MOS transistors. Since the fabrication of planar or non-planar transistors and ILD layer 14 is well known to those skilled in the art, the details of which are not explained herein for the sake of brevity.

Next, at least a metal interconnect structure is formed on the ILD layer 14 to electrically connect the aforementioned contact plugs, in which the metal interconnect structure preferably includes a selective stop layer (not shown) on the ILD layer 14, a first inter-metal dielectric (IMD) layer 16, and at least a metal interconnection 18 embedded in the first IMD layer 16. Preferably, the top surfaces of the metal interconnection 18 and the first IMD layer 16 are coplanar. It should be noted even though only a single metal interconnection 18 is formed in the first IMD layer 16 in this embodiment, the number or quantity of the metal interconnection 18 could all be adjusted depending on the demand of the product.

Preferably, the metal interconnection 18 is composed of a trench conductor. Nevertheless, according to other embodiment of the present invention, the metal interconnection 18 could also include a trench conductor, a via conductor, or combination thereof, and the metal interconnection 18 is electrically connected to other metal interconnections embedded within the first IMD layer 16 and/or stop layer according to dual damascene process. Since dual damascene process is well known to those skilled in the art, the details of which are not explained herein for the sake of brevity. In this embodiment, the metal interconnection 18 preferably includes a barrier layer 20, a liner 22 disposed on the barrier layer 20, and a metal layer 24 disposed on the liner 22, in which the barrier layer 20 and the liner 22 are U-shaped and the top surface of all three elements 20, 22, 24 is even with the top surface of the first IMD layer 16. Preferably, the barrier layer 20 is made of tantalum nitride (TaN), the liner 22 is made of cobalt (Co), the metal layer 24 is made of copper (Cu), the first IMD layer 16 is made of silicon oxide, and the stop layer is made of silicon nitride, but not limited thereto.

Next, a cap layer 26 is formed to cover the surface of the first IMD layer 16 and the metal interconnection 18, and a photo-etching process is conducted to remove part of cap layer 26 directly on top of the first IMD layer 16 so that the remaining cap layer 26 only covers the surface of the metal interconnection 18 and the two edges of the cap layer 26 are aligned with two edges of the metal interconnection 18 and the top surface of the adjacent first IMD layer 16 is exposed again. In this embodiment, the cap layer 26 and the liner 22 within the metal interconnection 18 are preferably made of same conductive or more specifically metal material such as cobalt. Next, a stop layer 28 and a second IMD layer 30 are sequentially formed on the cap layer 26, in which the stop layer 28 is conformally formed on the top surface of the first IMD layer 16 and top surface and sidewalls of the cap layer 26 and the second IMD layer 30 is covered entirely on the stop layer 28. In this embodiment, the cap layer 28 could include dielectric material such as but not limited to for example silicon nitride and the second IMD layer 30 and the first IMD layer 16 are preferably made of same material such as but not limited to for example silicon oxide.

Figure 2:
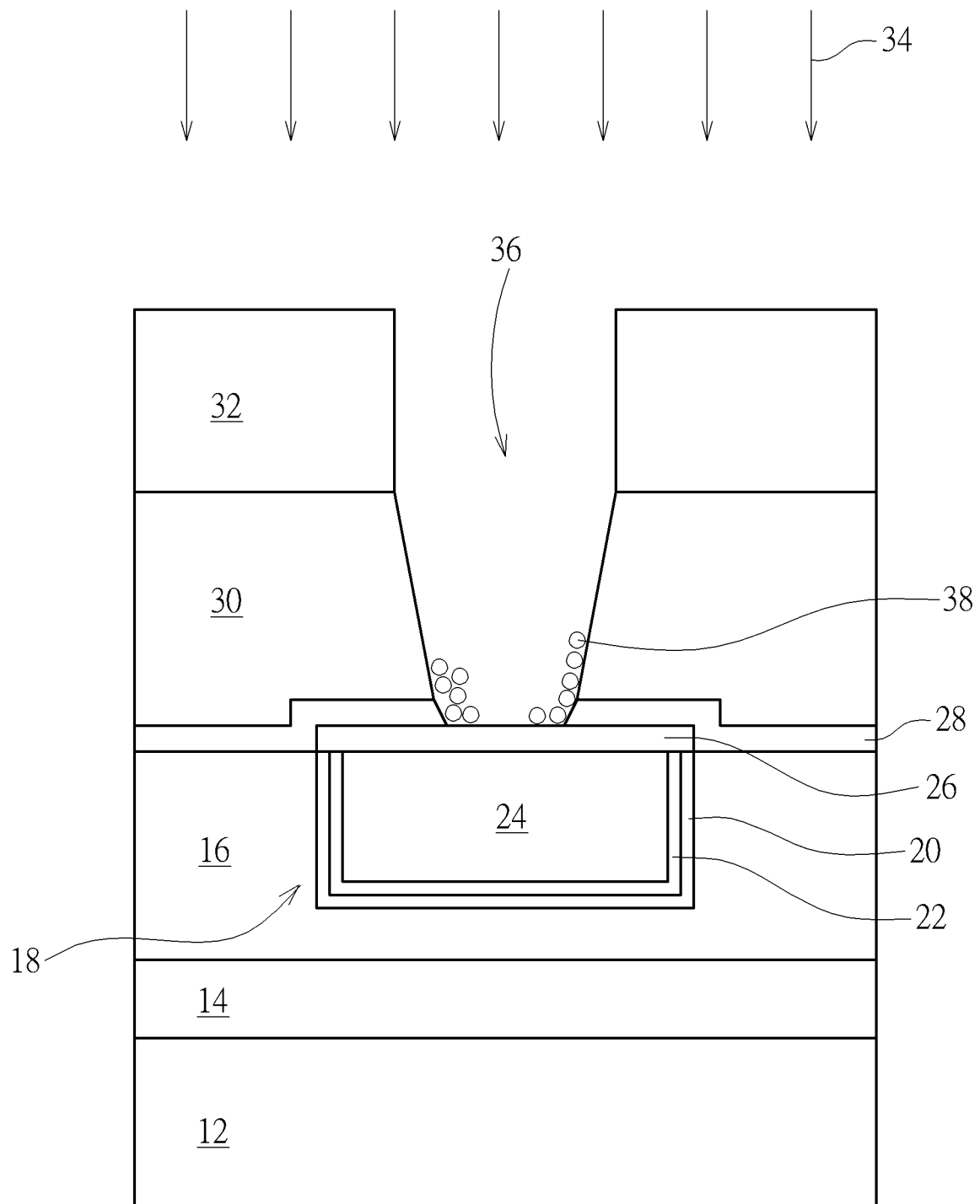

Next, as shown in FIG. 2, a patterned mask 32 is formed on the surface of the second IMD layer 30, and a first etching process 34 is conducted to remove part of the second IMD layer 30 and part of the stop layer 28 to form an opening 36. In this embodiment, the patterned mask 32 could include a single-layered structure made of patterned resist or a tri-layer structure made of an organic dielectric layer (ODL), a silicon-containing hard mask bottom anti-reflective coating (SHB), and a patterned resist, in which the step for forming the opening 36 in the patterned mask 32 could be accomplished by using the patterned resist as mask to remove part of the SHB and part of the ODL.

Preferably, the first etching process 34 conducted at this stage include a dry etching process, in which the dry etching process preferably uses a fluorine-containing gas such as carbon tetrafluoride ($CH_4$) to remove part of the second IMD layer 30 and part of the stop layer 28 to expose the surface of the cap layer 26 for forming the opening 36. It should be noted that when the first etching process 34 or dry etching process is conducted to remove part of the second IMD layer 30 to form the opening 36 and expose the top surface of the cap layer 26, part of the cap layer 26 made of Co may be oxidized to form or accumulate cobalt oxide (CoO) and/or fluorine-containing polymers 38 on the bottom of the opening 36, in particular the corner or corners included or contacted by the stop layer 28 and cap layer 26 at the bottom of the opening 36.

Figure 3:
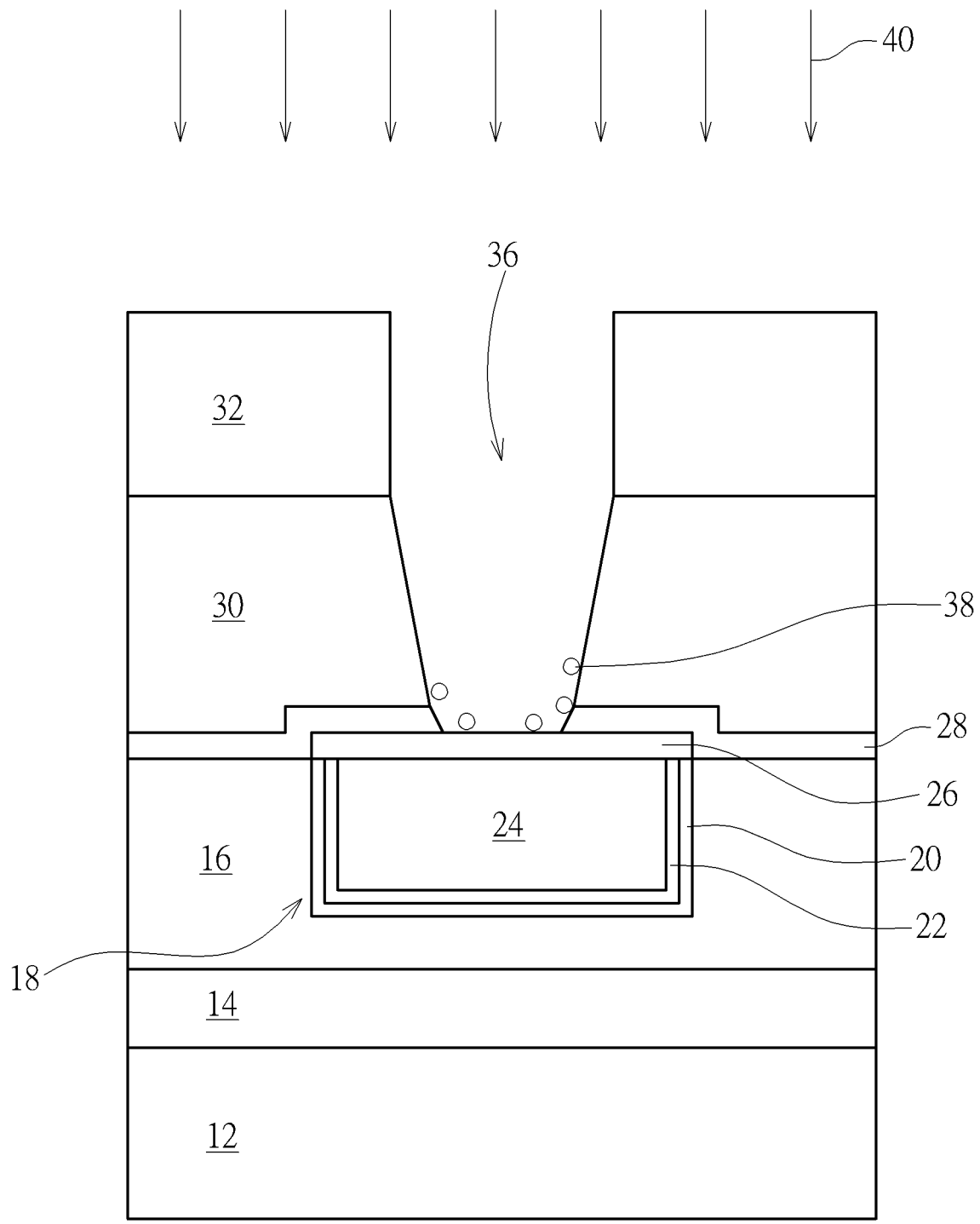

Next, as shown in FIG. 3, a plasma treatment process 40 is conducted to remove the polymers 38 generated during the first etching process 34 in the opening 36. Specifically, the plasma treatment process 40 conducted at this stage preferably uses a gas or combination of gases selected from the group consisting of hydrogen gas ($H_2$) and nitrogen gas ($N_2$) to reduce the content or concentration of polymers 38 accumulated on the bottom of the opening 36 so that the thickness of the cap layer 26 formed afterwards could be maintained. It should be noted that ideally even though most of the polymers 38 would be removed by the plasma treatment process 40, a small portion of the polymers 38 would still remain in the corners on the bottom of the opening 36 after the plasma treatment process 40 is completed. In this embodiment, the flow rate of nitrogen gas used during the plasma treatment process 40 is preferably around 50 sccm and the flow rate of hydrogen gas is around 100 sccm.

Figure 4:
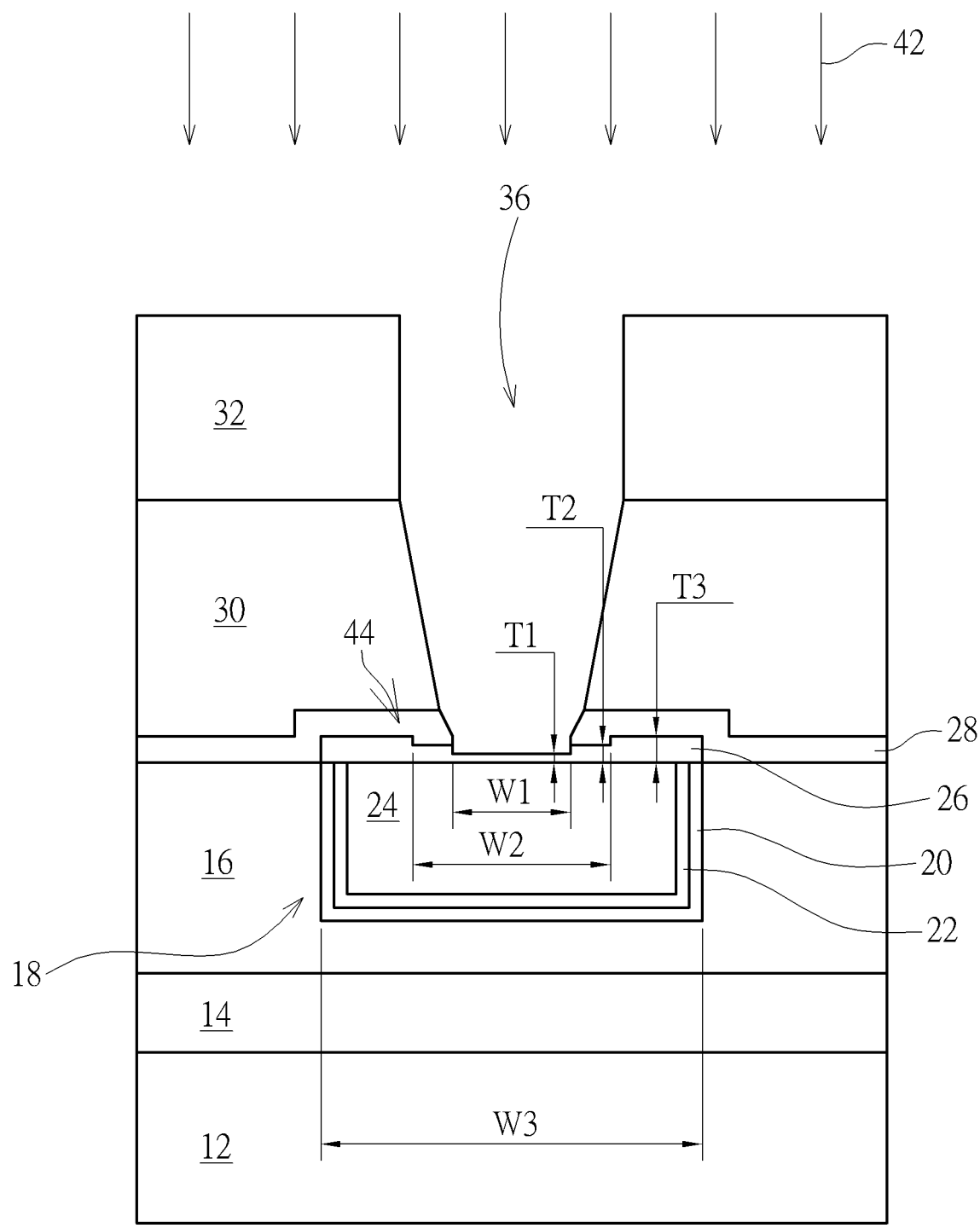

Next, as shown in FIG. 4, a second etching process 42 is conducted to remove the remaining polymers 38 accumulated on the bottom or more specifically bottom corners of the opening 36. In this embodiment, the second etching process 42 includes a wet etching process, which preferably uses an etchant including hydrogen peroxide ($H_2O_2$) to remove the remaining polymers 38 accumulated on the bottom corners of the opening 36 when the substrate 12 or semiconductor wafer is being spun. Preferably, the rotation of the chuck used for loading or carrying the substrate 12 during the second etching process 42 or wet etching process is between 200 rpm to 2000 rpm and the flow rate of the etchant such as $H_2O_2$ is between 0.5-2.0 liters per minute.

It should be noted that when the polymers 38 are removed by the second etching process 42, part of the cap layer 26 directly under the opening 36 is also removed at the same time without exposing the metal interconnection 18 underneath so that the top surface of the remaining cap layer 26 directly under the opening 36 is slightly lower than the top surface of the cap layer 26 on the adjacent two sides. Moreover, a small part of cap layer 26 adjacent to two sides of the opening 36 may also be removed to form steps 44 or step-shaped profiles as a result of diffusion effect when the second etching process 42 is conducted to remove part of the cap layer 26 directly under the opening 36.

Viewing from a more detailed perspective, the remaining cap layer 26 disposed on the surface of the metal interconnection 18 after the second etching process 42 is completed preferably includes three different thickness. For instance, the cap layer 26 directly under the opening 36 includes a first thickness T1, part of the cap layer 26 adjacent to two sides of the first thickness T1 as a result of the aforementioned diffusion effect includes a second thickness T2, and part of the cap layer 26 adjacent to two sides of the second thickness T2 and also aligned to edges of the metal interconnection 18 underneath includes a third thickness T3, in which the first thickness T1 is less than the second thickness T2 and the second thickness T2 is further less than the third thickness T3.

In this embodiment, the first thickness T1 is preferably between 8-25 Angstroms, the second thickness T2 is between 15-50 Angstroms, and the third thickness T3 is between 20-100 Angstroms. Moreover, the first thickness T1 also includes a first width W1, the second thickness T2 includes a second width W2, and the third thickness T3 includes a third width W3, in which the first width W1 is preferably around 34 nm, the second width W2 is around 68 nm, and the third width W3 is preferably greater than 100 nm.

It should be noted that even though none of the cap layer 26 were removed during the first etching process 34 or dry etching process in FIG. 2 until some of the cap layer 26 were removed during the second etching process 42 in FIG. 4, according to an embodiment of the present invention, it would also be desirable to remove part of the cap layer 26 when the first etching process 34 is conducted to remove part of the second IMD layer 30 and part of the stop layer 28 to form the opening 36 so that the cap layer 26 directly under the opening 36 is slightly lower than the cap layer 26 on adjacent two sides to form step-shaped profiles 44. Next, the plasma treatment process 40 in FIG. 3 and the second etching process 42 or wet etching process in FIG. 4 are conducted to form cap layer 26 having three different thicknesses, which is also within the scope of the present invention.

Figure 5:
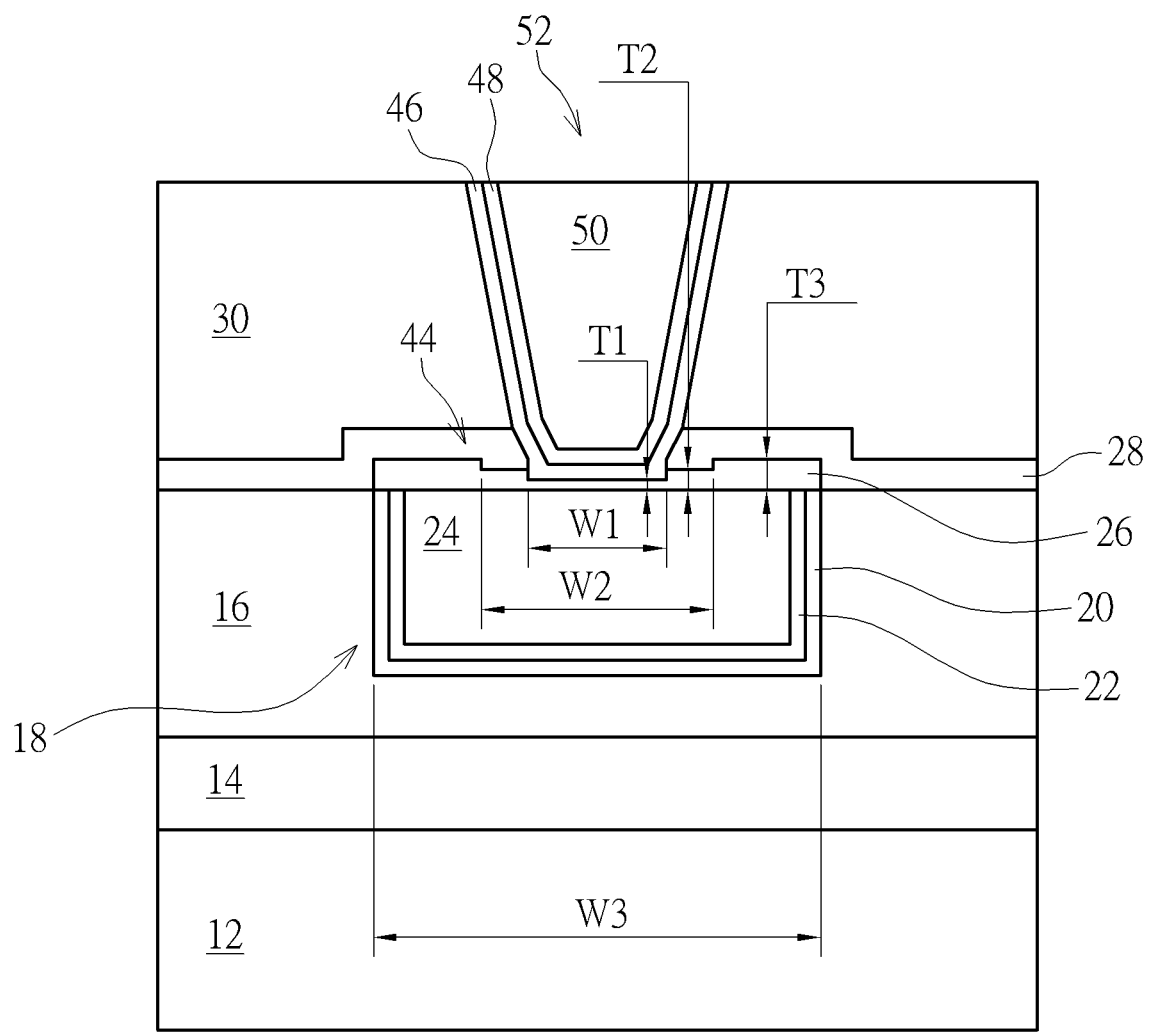

Next, as shown in FIG. 5, after removing the patterned mask 32, a barrier layer 46 is formed in the opening 36, a liner 48 is formed on the barrier layer 46, and a metal layer 50 is formed on the liner 48 to fill the opening 36. Next, a planarizing process such as chemical mechanical polishing (CMP) process is conducted to remove part of the metal layer 50, part of the liner 48, and part of the barrier layer 46 to form another metal interconnection 52 or more specifically a via conductor. Similar the composition of the metal interconnection 18 or trench conductor underneath, the barrier layer 46 is preferably made of TaN, the liner 48 preferably is made of Co, and the metal layer 50 is made of Cu, but not limited thereto. This completes the fabrication of a metal interconnect structure according to an embodiment of the present invention.

Referring again to FIG. 5, FIG. 5 further illustrates a structural view of a semiconductor device or metal interconnect structure according to an embodiment of the present invention. As shown in FIG. 5, the semiconductor device includes metal interconnection 18 disposed in the first IMD layer 16, another metal interconnection 52 on the metal interconnection 18, a cap layer 26 disposed on the surface of the metal interconnection 18 and directly contacting the metal interconnections 18, 52, a stop layer 28 covering and directly contacting the top surface of the first IMD layer 16 and cap layer 26, and a second IMD layer 30 disposed on the stop layer 28 and surrounding the metal interconnection 52.

Preferably, the cap layer 26 includes a first thickness T1 between the metal interconnection 18 and metal interconnection 52, a second thickness T2 adjacent to two sides of the first thickness T1, and a third thickness T3 adjacent to two sides of the second thickness T2, in which the first thickness T1 is less than the second thickness T2 and the second thickness T2 is also less than the third thickness T3. Preferably, the cap layer 26 and the liners 22, 48 within the metal interconnections 18, 52 are made of same conductive or metal material such as Co, the stop layer 28 on the other hand could be made of dielectric material such as SiN or SiCN.

Figure 6:
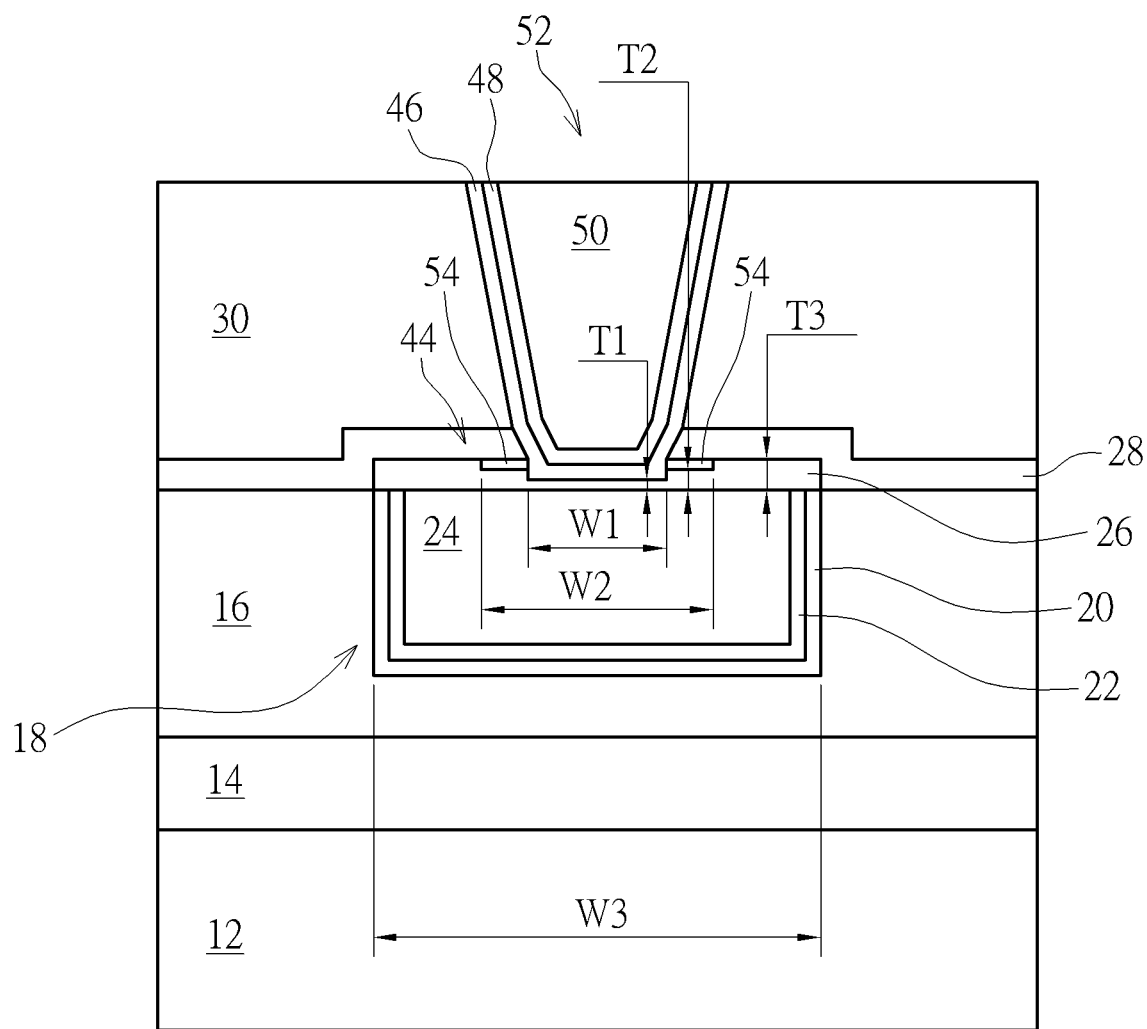
FIG. 6 illustrates a structural view of a metal interconnect structure according to an embodiment of the present invention.

Referring to FIG. 6, FIG. 6 illustrates a structural view of a metal interconnection according to an embodiment of the present invention. As shown in FIG. 6, it would also be desirable to adjust the parameter of the fabrication process when part of the cap layer 26 is removed in FIG. 4 and barrier layer 46, liner 48, and metal layer 50 are deposited to form metal interconnection 52 in FIG. 5 to form air gaps 54 in the cap layer 26 adjacent to two sides of the metal interconnection 52. Structurally, each of the air gaps 54 is surrounded by the cap layer 26, the barrier layer 46, and the stop layer 28. It should be noted that even though the top surface of the air gaps 54 is even with the top surface of the cap layer 26 in this embodiment, according to other embodiment of the present invention, the top surface of the air gaps 54 could also be slightly higher than or lower than the top surface of the cap layer 26, which are all within the scope of the present invention.

Typically, etching processes in conventional metal interconnect used to remove IMD layer to form openings for metal interconnections often removes the cap layer made of Co from the top surface of the metal interconnection and results in discontinuous cap layer. This causes the conductive material filled afterwards to contact the lower level metal interconnections directly and induces electrical migration effect thereby affecting the reliability of the whole device. To resolve this issue, the present invention first conducts a first etching process or dry etching process to remove part of the IMD layer to form an opening, conducts a plasma treatment process to remove majority of polymers accumulated in the bottom corners of the opening, conducts a second etching process or wet etching process to remove the remaining polymers by adjusting the rotation speed of the etching process and the flow rate of the etchant while not etching through the cap layer, and then deposits conductive materials into the opening to contact the cap layer directly for forming metal interconnection. According to a preferred embodiment of the present invention, the remaining cap layer disposed on the lower level metal interconnection preferably includes multiple thicknesses or step-shaped profiles while the layer itself still remained as a continuous structure covering the surface of the metal interconnection overall and such design could be used to improve the overall reliability of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal interconnect structure, comprising:
    a first metal interconnection in an inter-metal dielectric (IMD) layer on a substrate, wherein a top surface of the first metal interconnection is even with a top surface of the IMD layer;
    a second metal interconnection on the first metal interconnection;
    a cap layer between and directly contacting the first metal interconnection and the second metal interconnection, wherein the cap layer comprises conductive material; and
    an air gap in the cap layer.

2. The metal interconnect structure of claim 1, wherein the cap layer comprises a first thickness between the first metal interconnection and the second metal interconnection and a second thickness adjacent to two sides of the first thickness.

3. The metal interconnect structure of claim 2, wherein the second thickness is greater than the first thickness.

4. The metal interconnect structure of claim 2, wherein the cap layer comprises a third thickness adjacent to two sides of the second thickness.

5. The metal interconnect structure of claim 4, wherein the third thickness is greater than the second thickness.

6. The metal interconnect structure of claim 1, wherein the second metal interconnection comprises:
    a barrier layer contacting the cap layer;
    a liner on the barrier layer; and
    a metal layer on the liner.

7. The metal interconnect structure of claim 6, wherein the barrier layer and the liner are U-shaped.

8. The metal interconnect structure of claim 6, wherein the cap layer and the liner comprise same material.

9. The metal interconnect structure of claim 6, wherein the cap layer and the liner comprise cobalt (Co).

* * * * *